United States Patent
Reiley et al.

(10) Patent No.: US 7,653,095 B2
(45) Date of Patent: Jan. 26, 2010

(54) ACTIVE BANDWIDTH CONTROL FOR A LASER

(75) Inventors: Daniel J. Reiley, San Diego, CA (US); German E. Rylov, Poway, CA (US); Robert A. Bergstedt, Carlsbad, CA (US)

(73) Assignee: Cymer, Inc., San Diego, CA (US)

( * ) Notice: Subject to any disclaimer, the term of this patent is extended or adjusted under 35 U.S.C. 154(b) by 363 days.

(21) Appl. No.: 11/173,988

(22) Filed: Jun. 30, 2005

(65) Prior Publication Data

US 2007/0001127 A1    Jan. 4, 2007

(51) Int. Cl.
    *H01S 3/10*    (2006.01)
(52) U.S. Cl. ............... 372/20; 372/55; 372/57
(58) Field of Classification Search ............ 372/20, 372/55, 57
    See application file for complete search history.

(56) References Cited

U.S. PATENT DOCUMENTS

| | | | |
|---|---|---|---|
| 2,045,093 A | 6/1936 | Newcomer | |
| 2,121,567 A * | 6/1938 | Newcomer | 359/669 |
| 4,223,279 A | 9/1980 | Bradford, Jr. et al. | 331/94.5 |
| 4,455,658 A | 6/1984 | Sutter et al. | 372/38 |
| 4,959,840 A | 9/1990 | Akins et al. | 372/57 |
| 5,023,884 A | 6/1991 | Akins et al. | 372/57 |
| 5,025,445 A | 6/1991 | Anderson et al. | 372/20 |
| 5,025,446 A | 6/1991 | Kuizenga | 372/21 |
| 5,189,678 A | 2/1993 | Ball et al. | 372/28 |
| 5,243,614 A | 9/1993 | Wakara et al. | 372/29 |
| 5,313,481 A | 5/1994 | Cook et al. | 372/37 |
| 5,315,611 A | 5/1994 | Ball et al. | 372/56 |
| 5,359,620 A | 10/1994 | Akins | 372/5 R |
| 5,448,580 A | 9/1995 | Birx et al. | 372/38 |
| 5,471,965 A | 12/1995 | Kapich | 123/565 |
| 5,562,334 A * | 10/1996 | Wortel | 353/69 |
| 5,597,670 A * | 1/1997 | Aketagawa et al. | 430/30 |
| 5,621,523 A | 4/1997 | Oobayashi et al. | 356/336 |
| 5,852,621 A | 12/1998 | Sandstrom | 372/25 |
| 5,863,017 A | 1/1999 | Larson et al. | 248/176.1 |
| 5,864,574 A | 1/1999 | Welch et al. | 372/50 |
| 5,953,360 A | 9/1999 | Vitruk et al. | 372/87 |

(Continued)

FOREIGN PATENT DOCUMENTS

JP    HEI 04-036622    2/1992

(Continued)

*Primary Examiner*—Minsun Harvey
*Assistant Examiner*—Kinam Park
(74) *Attorney, Agent, or Firm*—Matthew K. Hillman (57) ABSTRACT

In a first aspect, a lithography apparatus may comprise a mask designed using optical proximity correction (OPC), a pulsed laser source, and an active bandwidth control system configured to increase the bandwidth of a subsequent pulse in response to a measured pulse bandwidth that is below a predetermined bandwidth range and increase a bandwidth of a subsequent pulse in response to a measured pulse bandwidth that is above the predetermined bandwidth range. In another aspect an active bandwidth control system may include an optic for altering a wavefront of a laser beam in a laser cavity of the laser source to selectively adjust an output laser bandwidth in response to the control signal. In yet another aspect, the bandwidth of a laser having a wavelength variation across an aperture may be actively controlled by an aperture blocking element that is moveable to adjust a size of the aperture.

28 Claims, 7 Drawing Sheets

U.S. PATENT DOCUMENTS

| | | | |
|---|---|---|---|
| 5,970,076 A | 10/1999 | Hamada | 372/20 |
| 5,978,394 A | 11/1999 | Newman et al. | 372/32 |
| 5,991,324 A | 11/1999 | Knowles et al. | 372/57 |
| 6,005,879 A | 12/1999 | Sandstrom et al. | 372/25 |
| 6,016,325 A | 1/2000 | Ness et al. | 372/38 |
| 6,018,537 A | 1/2000 | Hofmann et al. | 372/25 |
| 6,028,880 A | 2/2000 | Carlesi et al. | 372/58 |
| 6,040,552 A | 3/2000 | Jain et al. | 219/121.7 |
| 6,043,883 A | 3/2000 | Leckel et al. | 356/346 |
| 6,067,311 A | 5/2000 | Morton et al. | 372/57 |
| 6,088,379 A | 7/2000 | Owa et al. | 372/97 |
| 6,094,448 A | 7/2000 | Fomenkov et al. | 372/102 |
| 6,104,735 A | 8/2000 | Webb | 372/37 |
| 6,128,323 A | 10/2000 | Myers et al. | 372/38 |
| 6,151,349 A | 11/2000 | Gong et al. | 372/58 |
| 6,160,831 A | 12/2000 | Kleinschmidt et al. | 372/57 |
| 6,164,116 A | 12/2000 | Rice et al. | 73/1.72 |
| 6,192,064 B1 | 2/2001 | Algots et al. | 372/99 |
| 6,208,674 B1 | 3/2001 | Webb et al. | 372/57 |
| 6,208,675 B1 | 3/2001 | Webb | 372/58 |
| 6,219,368 B1 | 4/2001 | Govorkov | 372/59 |
| 6,240,117 B1 | 5/2001 | Gong et al. | 372/58 |
| 6,317,448 B1 | 11/2001 | Das et al. | 372/60 |
| 6,330,261 B1 | 12/2001 | Ishihara et al. | 372/38.1 |
| 6,392,743 B1 | 5/2002 | Zambon et al. | 355/69 |
| 6,408,260 B1 | 6/2002 | Watts et al. | 702/188 |
| 6,414,979 B2 | 7/2002 | Ujazdowski et al. | 372/87 |
| 6,442,181 B1 | 8/2002 | Oliver et al. | 372/58 |
| 6,456,380 B1 | 9/2002 | Naganurna | 356/450 |
| 6,477,193 B2 | 11/2002 | Oliver et al. | 372/58 |
| 6,493,374 B1 | 12/2002 | Fomenkov et al. | 372/102 |
| 6,496,528 B2 | 12/2002 | Titus et al. | 372/102 |
| 6,567,450 B2 | 5/2003 | Myers et al. | 372/55 |
| 6,580,517 B2 | 6/2003 | Lokai et al. | 356/519 |
| 6,611,336 B1 | 8/2003 | Walmsley et al. | 356/450 |
| 6,621,580 B2 | 9/2003 | Myatt et al. | 356/519 |
| 6,625,191 B2 | 9/2003 | Knowles et al. | 372/55 |
| 6,690,704 B2 | 2/2004 | Fallon et al. | 372/58 |
| 6,693,939 B2 | 2/2004 | Klene et al. | 372/58 |
| 6,735,236 B2 | 5/2004 | Cybulski et al. | 372/102 |
| 6,750,972 B2 | 6/2004 | Sandstrom et al. | 356/454 |
| 6,757,316 B2 | 6/2004 | Newman et al. | 372/57 |
| 6,778,584 B1 | 8/2004 | Partlo et al. | 372/99 |
| 6,801,560 B2 | 10/2004 | Knowles et al. | 372/55 |
| 6,853,653 B2 | 2/2005 | Spangler et al. | 372/20 |
| 6,882,674 B2 | 4/2005 | Wittak et al. | 372/58 |
| 2002/0006149 A1 | 1/2002 | Spangler et al. | 372/61 |
| 2002/0048288 A1* | 4/2002 | Kroyan et al. | 372/20 |
| 2002/0101589 A1 | 8/2002 | Sandstrom et al. | 356/334 |
| 2002/0154668 A1 | 10/2002 | Knowles et al. | 372/55 |
| 2002/0154671 A1 | 10/2002 | Knowles et al. | 372/57 |
| 2003/0012234 A1 | 1/2003 | Watson et al. | 372/25 |
| 2003/0018072 A1 | 1/2003 | Joshi et al. | 514/527 |
| 2003/0099269 A1 | 5/2003 | Ershov et al. | 372/55 |
| 2003/0138019 A1 | 7/2003 | Rylov et al. | 372/58 |

FOREIGN PATENT DOCUMENTS

| | | |
|---|---|---|
| JP | HEI 05-067821 | 3/1993 |
| JP | HEI 05-312646 | 11/1993 |
| JP | HEI 05-322661 | 12/1993 |
| JP | HEI 06-112571 | 4/1994 |
| JP | HEI 06-160187 | 6/1994 |
| JP | HEI 11-298084 | 10/1999 |
| JP | 2004-311766 | 11/2004 |

* cited by examiner

ACTIVE BANDWIDTH CONTROL FOR A LASER

FIELD OF THE INVENTION

The present invention relates to lasers. The present invention is particularly, but not exclusively useful for providing a laser output having a bandwidth that is controlled within a pre-selected range.

BACKGROUND OF THE INVENTION

Pulsed lasers, such as KrF excimer lasers, ArF excimer lasers and molecular fluorine ($F_2$) lasers, are often used in conjunction with a lithography tool to selectively expose a photoresist in a semiconductor wafer fabrication process. In these processes, the mask and optics in the lithography tool are typically optimized for a particular laser wavelength. More specifically, the tool is typically optimized for a particular center wavelength. For a variety of reasons, the center wavelength of the light exiting the laser may drift over time and, thus, a feedback network may be employed to detect the center wavelength exiting the laser and modify one or more laser parameters to correct the wavelength as necessary.

Recently, optical proximity correction (OPC) has been employed to more exactly obtain a desired exposure pattern on the resist by selectively changing the sizes and shapes of corresponding patterns on the mask. More specifically, OPC perturbs mask aperture shapes to systematically compensate for nonlinear feature distortions arising from optical diffraction and resist process effects. Common types of OPC may include: (1) the introduction of serifs, hammerheads and tomahawks in the mask pattern to reduce corner rounding and line-end shortening in the resist pattern; (2) the use of notches to control linewidth accuracy; and (3) the use of sub-resolution assist features (SRAFs, or scattering bars) for narrow gate geometries.

Heretofore, efforts have been drawn largely to reducing the spectral bandwidth of the light exiting the laser source to ever smaller dimensions. In short, large bandwidths have been troublesome because, as indicated above, lithography tool optics are generally designed for a specific center wavelength and chromatic doublets are generally unavailable at the wavelengths of interest, e.g., 248 for KrF sources and 193 nm for ArF sources. More recently, and more particularly with the recent use of OPC, the design rules used to generate complex masks require bandwidth stability rather than mere bandwidth reduction. As used herein, the term "bandwidth stability" means controlling bandwidth within a spectral range having both a maximum acceptable bandwidth value and a minimum acceptable bandwidth value.

In one type of arrangement used to measure the wavelength and spectral bandwidth of a laser, a portion of the emitted light is made incident upon an etalon. The etalon creates an interference fringe pattern having concentric bands of dark and light levels due to destructive and constructive interference by the laser light. The fringe pattern may then be optically detected by a sensitive photodetector array (PDA). In the fringe pattern, the concentric bands surround a center bright portion. The position of the bright center portion of the interference pattern can be used to determine wavelength to a relatively coarse degree, such as to within 5 picometers (pm). The diameter of a light band is then used to determine the wavelength of the laser output to a fine degree, such as to within 0.01-0.03 pm. Also, the width of a light band may be used to determine the spectral bandwidth of the laser output.

In one method commonly used to characterize spectral bandwidth, the bandwidth at 50% peak intensity is measured. This definition of bandwidth is referred to as full width, half maximum (FWHM). Another definition of bandwidth, sometimes referred to as spectral purity, involves measuring a spectrum width where a selected percentage of the entire spectral energy is concentrated. For example, a common indicator is E95 which corresponds to the spectrum width where 95% of the entire spectral energy is concentrated.

Various methods can be used for wavelength tuning of lasers. Typically, the tuning takes place in a device referred to as a line narrowing package or line narrowing module. A typical technique used for line narrowing and tuning of excimer lasers is to provide a window at the back of the discharge cavity through which a portion of the laser beam passes into the line narrowing package. There, the portion of the beam is expanded in a beam expander and directed to an echelle grating that is aligned at a Littrow angle relative to the expanded beam. The grating reflects a narrow portion of the laser's untuned broader spectrum back into the discharge chamber where it is then amplified. With this arrangement, the laser can be tuned to a target center wavelength by changing the angle at which the beam illuminates the grating. This may be done by adjusting the position of the grating or providing a moveable mirror in the beam path.

Modern gas discharge lasers may be operable at a relatively high repetition rate, e.g., four to six kilohertz, and modem advancements are pushing this number higher. In a typically lithography procedure, the lithography tool may demand a burst of pulses, e.g., for exposing a particular mask position. As used herein, the term "burst of pulses" and its derivatives means a continuous train of pulses demanded by the lithography tool at the operable repetition rate of a discharge laser. A typical burst of pulses may include, but is not limited to, about 100-300 pulses. The termination of a burst of pulses may be achieved by terminating electrode discharge in the laser, the use of an appropriate shutter, or other suitable techniques known in the pertinent art. Thus, an active control system may alter a pulse characteristic within a burst of pulses by measuring a characteristic of a first pulse within the burst and using the measurement to alter a characteristic of at least one other pulse in the burst of pulses.

Typical industry specifications may require a laser output having an average center wavelength or average bandwidth (FWHM and/or E95) averaged over as a series of pulses referred to as a "pulse window". A typical pulse window may be, for example, 30 pulses, and, in general, may be shorter than a "burst of pulses". Thus, an active control system may alter a pulse characteristic within a pulse window by measuring a characteristic of a first pulse within the window and may be the measurement to alter a characteristic of at least one other pulse in the pulse window. Another level of active control is referred to as "pulse to pulse" control. In this technique, an active control system may measure a characteristic of a pulse and use the measurement to alter a characteristic of the very next pulse exiting the laser after the measured pulse.

With the above considerations in mind, Applicants disclose systems and methods for actively controlling the bandwidth of a laser during a burst of pulses.

SUMMARY OF THE INVENTION

In a first aspect of an embodiment of the present invention, a lithography apparatus for exposing a resist with a pre-selected pattern may comprise a mask designed using optical proximity correction (OPC) to produce the pre-selected pattern on the resist. For this aspect, the apparatus may include a laser source for generating a laser light beam for transmission through the mask to expose the resist and an instrument measuring laser bandwidth. In addition, the laser source may comprise an active bandwidth control system to increase a bandwidth of a subsequent pulse in response to a measured pulse bandwidth that is below a predetermined bandwidth range and decrease a bandwidth of a subsequent pulse in response to a measured pulse bandwidth that is above the predetermined bandwidth range.

In another aspect of an embodiment of the present invention, an active bandwidth control system operable within a burst of pulses from a laser source may comprise an instrument to measure laser bandwidth and produce a control signal proportional to a measured bandwidth. Also, the active bandwidth control system may include an optic for altering a wavefront of a laser beam in a laser cavity of the laser source to selectively adjust an output laser bandwidth in response to the control signal. In one implementation, the optic is configured to alter coma.

In yet another aspect of an embodiment of the present invention, an active bandwidth control system for a laser source which produces a laser beam having a wavelength variation across an aperture may comprise an instrument for measuring laser bandwidth and for producing a control signal proportional thereto. The control system may also include an aperture blocking element that is moveable to adjust a size of the aperture to selectively vary an output laser bandwidth in response to the control signal.

DETAILED DESCRIPTION OF PREFERRED EMBODIMENTS

Figure 1:
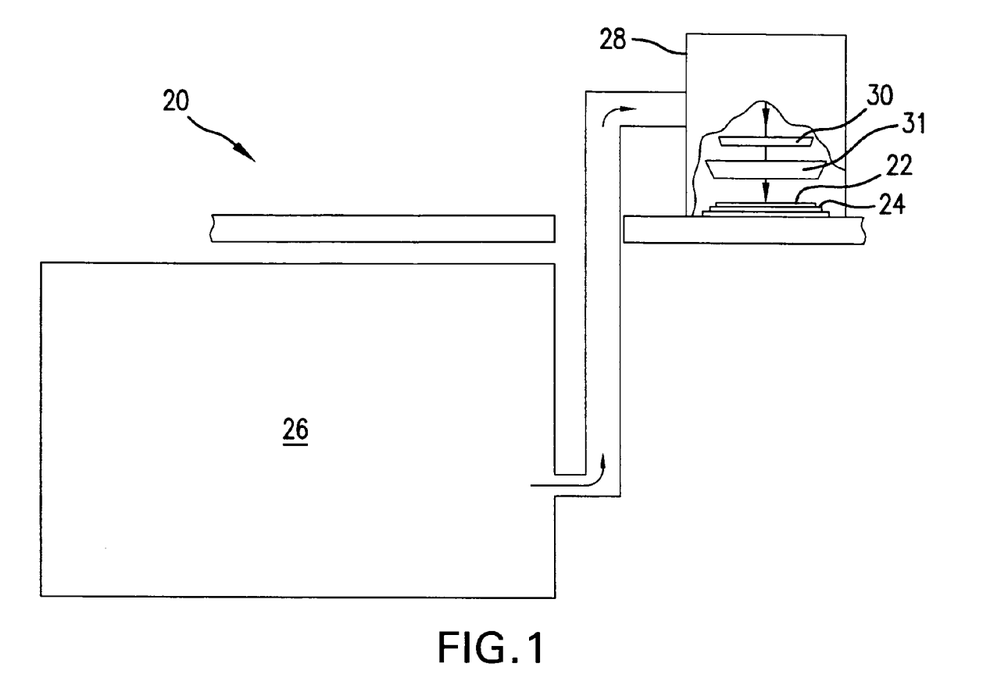
FIG. 1 shows a simplified schematic view of lithography system having a laser source and a lithography tool including a mask designed with optical proximity correction.

With initial reference to FIG. 1, a lithography apparatus is shown and generally designated 20 which can be used, for example, to expose a selected pattern on a photoresist layer 22 that has been deposited on a wafer 24. As shown, the primary components of the apparatus 20 include a laser source 26 and a lithography tool 28, which may be a scanner, stepper, step and scan or any other suitable lithography tool known in the pertinent art. For the apparatus 20, the laser source 26 may be a line-tuned gas discharge laser, e.g., a pulsed KrF excimer lasers, pulsed ArF excimer laser or pulsed molecular fluorine ($F_2$) laser having a line narrowing module, and may include one or more discharge chambers. In particular, the laser source 26 may include one or more oscillator chambers, so-called power oscillators (if laser seeded) and master oscillators (if unseeded), and may include one or more laser seeded amplifying chambers, so-called power amplifiers. Alternatively, as shown in FIG. 2, the laser source may have a single oscillating chamber 28.

For the apparatus 20 shown in FIG. 1, a line-tuned, pulsed laser beam exits the laser source and is delivered to the lithography tool 28. Within the lithography tool 28, the beam passes through apertures (or transmissive elements) formed in a mask 30 and exposes a pattern on the photoresist layer 22. Typically, the lithography tool 28 includes provisions to move the mask 30 and/or wafer 24 relative to the light beam, and in addition, may include projection optics 31 to reduce the size of the exposure pattern between the mask 30 and photoresist layer 22. Moreover, in some, but not necessarily all, implementations of the apparatus 20, the features, e.g., apertures/transmissive elements, of the mask 30 are designed to reduce optical proximity effects in a process widely known in the art as optical proximity correction (OPC).

Figure 2:
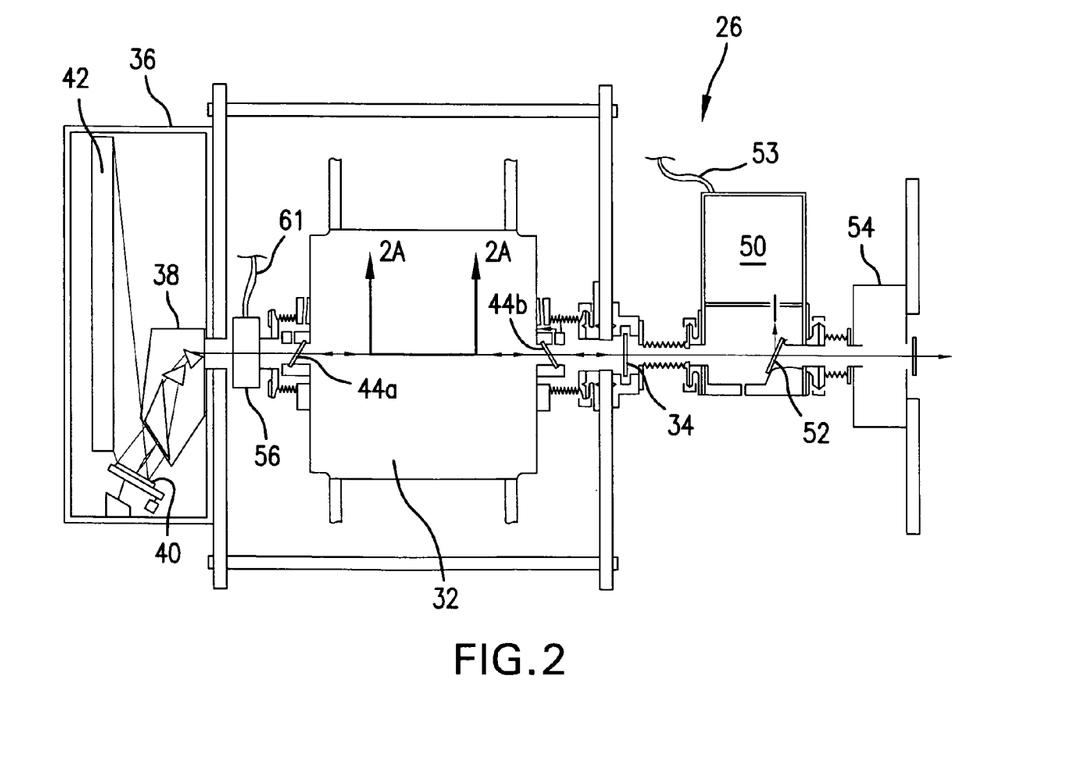
FIG. 2 shows more detailed schematic view of an exemplary laser source having an active bandwidth control for use in the system shown in FIG. 1.

FIG. 2 shows the laser source 26 in greater detail. As shown, the laser source may include a single resonant chamber 32 having an output coupler 34 at one end and a line narrowing module 36 at the other end. For the source 26, the line narrowing module 36 may include a beam expander 38, e.g., having one or more prisms as shown, a position-adjustable mirror 40 and an echelle grating 42 that is aligned at a Littrow angle relative to the expanded beam. In operation, the grating 42 reflects a narrow portion of the laser's untuned broader spectrum back into the gas discharge chamber, e.g., the portion of the resonant chamber between the chamber windows 44a,b, where the narrow spectrum portion is then amplified. With this arrangement, the laser can be tuned to a target center wavelength by changing the angle at which the incident beam illuminates the grating.

Figure 2A:
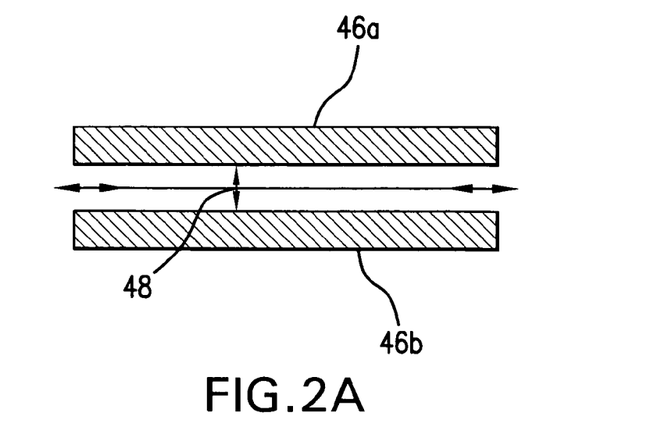
FIG. 2A is a sectional view showing discharge electrodes and arc direction as seen along line 2A-2A in FIG. 2.
Figure 3:
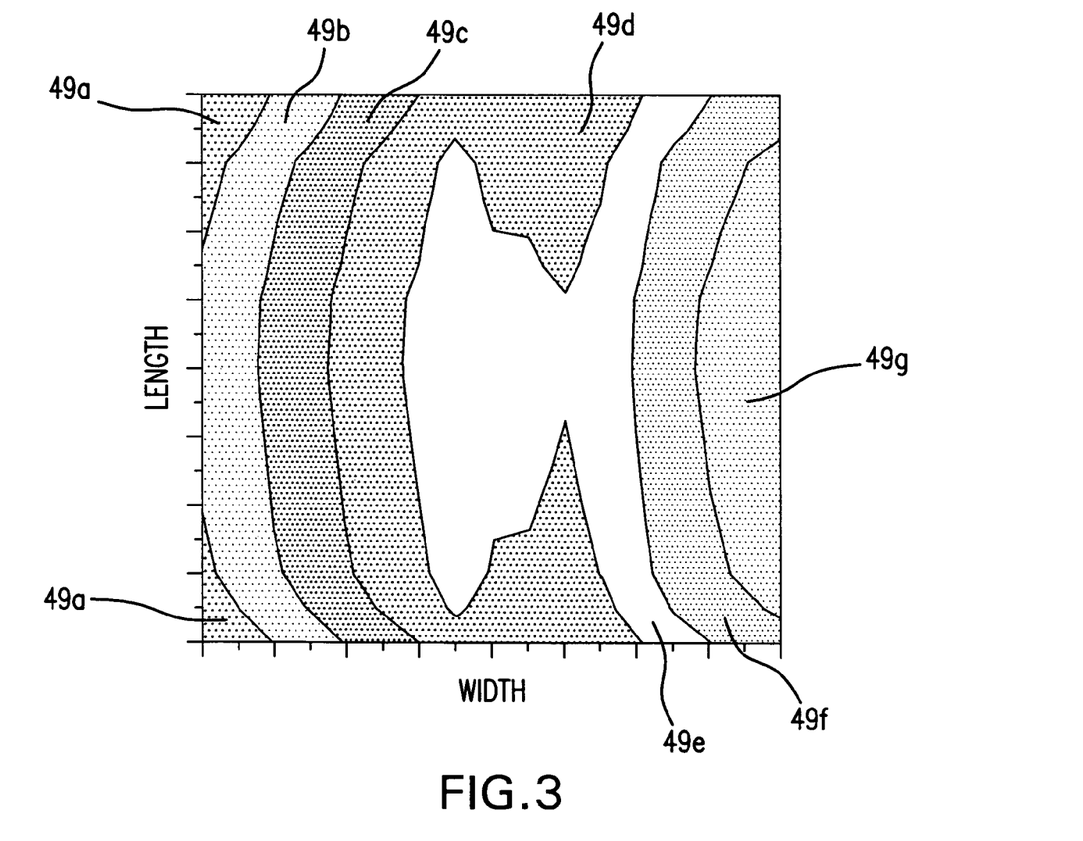
FIG. 3 shows the variation of wavelength across an aperture normal to a beam path for a typical gas discharge laser.

Within the discharge chamber, the laser source 26 may include a pair of spaced apart discharge electrodes 46a,b defining an arc direction 48 as shown in FIG. 2A. With this arrangement, a beam having a somewhat rectangular shape is established having a length parallel to the arc direction and a width perpendicular thereto. For example, a typical excimer discharge laser may have a beam length of about 12 mm and a width of about 3 mm. In addition, for the tuned gas discharge laser source 26 shown, the wavelength may vary across the width of the beam, e.g., as shown in FIG. 3. More specifically, as seen in FIG. 3, the spectral distribution across the width of the beam can be broken into several, e.g., seven, spectral range sections 49a-g (note: each section 49 shown includes a spectral range of 100 fm) with the wavelength increasing gradually from the left side of FIG. 3 to the right side of FIG. 3.

FIG. 2 also shows that the laser source 26 may include a wavemeter 50 (shown schematically in FIG. 2) downstream of the output coupler 34 which receives a portion of the beam output from the coupler 34 via beamsplitter 52. A shutter module 54 can also be provided downstream of the wavemeter 50, as shown. For the laser source 26, the wavemeter may measure one or more pulse characteristics, which may include but are not necessarily limited to: pulse energy, coarse central wavelength, fine central wavelength, FWHM bandwidth and E95 bandwidth. A suitable wavemeter for performing measurements, calculating one or more pulse characteristics and producing an output signal indicative thereof, e.g., over output cable 53, is disclosed in U.S. Pat. No. 6,894,785 titled, "Gas Discharge MOPA Laser Spectral Analysis Module" which issued on May 17, 2005, and in U.S. Pat. No. 6,539,046 titled, "Wavemeter For Gas Discharge Laser" which issued on Mar. 25, 2003, both of which are hereby incorporated by reference herein. In addition, techniques for calculating FWHM and E95 from wavemeter output data are disclosed in co-pending, co-owned U.S. patent application Ser. No. 10/615,321, filed on Jul. 7, 2003 and titled, "Optical Bandwidth Meter for Laser Light", and co-pending, co-owned U.S. patent application Ser. No. 10/609,223, filed on Jun. 26, 2003 and titled, "Method and Apparatus for Measuring Bandwidth of an Optical Output of a Laser", both of which are hereby incorporated by reference herein. Other instruments known in the pertinent art for measuring bandwidth may be used. Wavemeters disclosed above may be capable of measuring characteristics, e.g., bandwidth, pulse energy, wavelength, of each pulse, even for high repetition rate lasers, e.g., 4-6 kHz, and may produce an output for each pulse, or may produce an output for a plurality of pulses, e.g., an average or some other statistical parameter.

The laser source 26 may also include, as part of an active bandwidth control system, an adjustable aperture blocking subsystem 56, as shown schematically in FIG. 2. Although the adjustable aperture blocking subsystem 56 is shown positioned along the laser beam path between the discharge chamber window 44a and the line narrowing module 36, it is to be appreciated that the adjustable aperture blocking subsystem 56 could be positioned at other locations along the beam path including, but not limited to: a position within the line narrowing module 36, a position between the discharge chamber window 44b and the output coupler 34, a position between the output coupler 34 and the beam splitter 52 for the wavemeter 50, a position downstream of the beam splitter 52.

Figure 4:
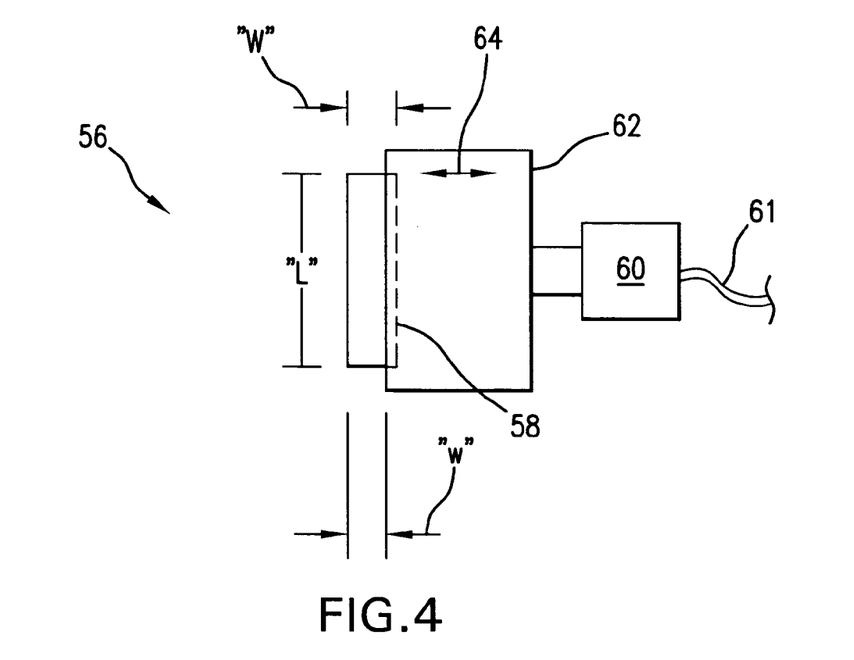
FIG. 4 shows a detailed view of an aperture blocking element that is moveable to adjust a size of a beam path aperture to selectively vary an output laser bandwidth in response to the control signal from a bandwidth measuring instrument.

Features of the subsystem 56 are shown in further detail in FIG. 4. As shown there, the subsystem 56 may include a fixed aperture 58, which may have, for example, a fixed length, "L", aligned with the arc direction 48 (see FIG. 2) and a fixed width, "W". Exemplary values for an excimer laser may be L=12 mm and W=3 mm. As indicated above, the wavelength may vary (e.g., be chirped) across the width of the beam, e.g., as shown in FIG. 3. FIG. 2 shows that the subsystem 56 may include an actuator 60 coupled to an aperture blocking element, which for the embodiment shown may be, but is not necessarily limited to, a plate 62.

FIG. 4 shows that the actuator 60 may receive a control signal via cable 61 from the wavemeter 50 (see FIG. 2) or intermediary processor (not shown) and, in response, selectively move the plate 62 parallel to direction arrow 64 to partially block part of the beam and establish a temporary aperture width "w", as shown. Thus, the plate 62 is moveable, back and forth, to adjust a size of the beam aperture to selectively vary an output laser bandwidth in response to the control signal. For the subsystem 56, the actuator 60 may include a motor, e.g., stepper motor, servo motor or the like, and/or may include an actuable material, e.g., piezoelectric, magnetostrictive, etc. In one implementation, a motor is employed in combination with an actuable material with the former providing coarse movement control and the later providing extremely rapid, fine movement control.

Figure 5:
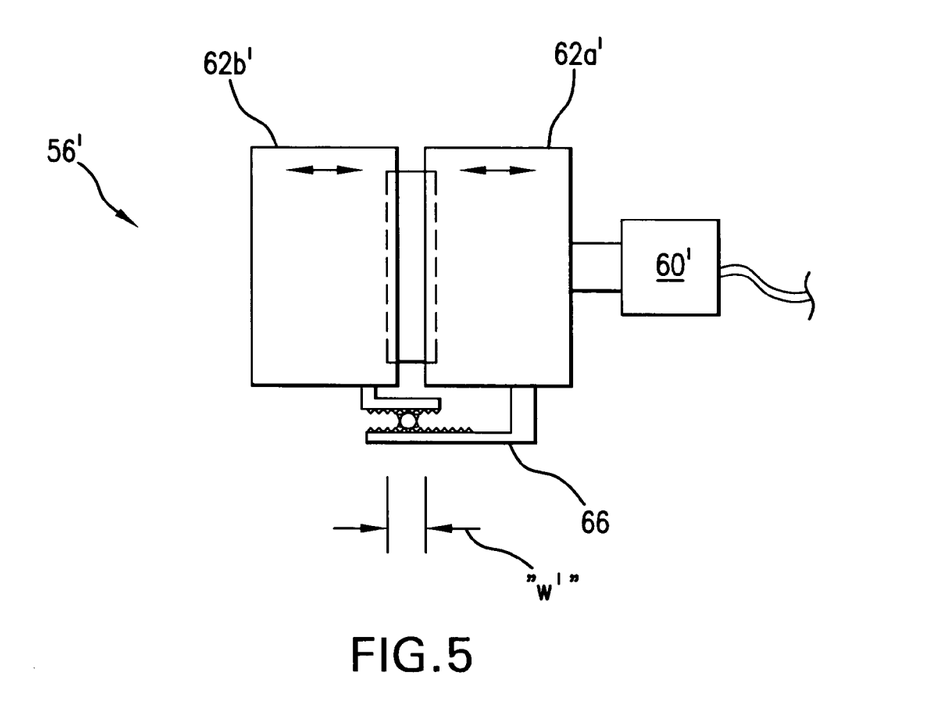
FIG. 5 shows a detailed view of another embodiment of an aperture blocking element two plates that are simultaneously moveable to adjust a size of a beam path aperture to selectively vary an output laser bandwidth in response to the control signal from a bandwidth measuring instrument.

FIG. 5 shows another embodiment, designated generally adjustable aperture blocking subsystem 56', which may form a part of an active bandwidth control system. The subsystem 56' may include a fixed aperture 58', and may include an actuator 60' coupled to an aperture blocking element, which for the embodiment shown may be, but is not necessarily limited to, a pair of plates 62a', 62b'. As shown, the plates 62a', 62b' may be coupled to the actuator 60' by a linkage 66 configured to allow the plates 62a', 62b' to move simultaneously in opposite directions, e.g. a linkage having two arms and a pivot therebetween. Thus, both plates 62a', 62b' and be moved together toward each other to reduce the size of the temporary aperture "w'" (reducing the bandwidth), or both plates 62a', 62b' and be moved together away from each other to enlarge the size of the temporary aperture "w'" (increasing the bandwidth). Alternatively, a pair of actuators (not shown) may be provided, with each actuator independently controlling the movement of a respective plate.

Depending of the laser repetition rate, movements of the aperture blocking element may be on a pulse-to pulse basis, e.g., a movement preceding each pulse, or may occur near the end of a pulse window, e.g., 3-50 pulses, e.g. to establish a pulse window bandwidth average within a specified range. Thus, a pulse measurement output may be used to move the aperture blocking element prior to the very next pulse or a subsequent pulse. In some cases, movement of the aperture blocking element may occur near the end of a burst of pulses, e.g., to establish a bandwidth average for a burst of pulses that is within a pre-determined specified range.

Figure 6A:
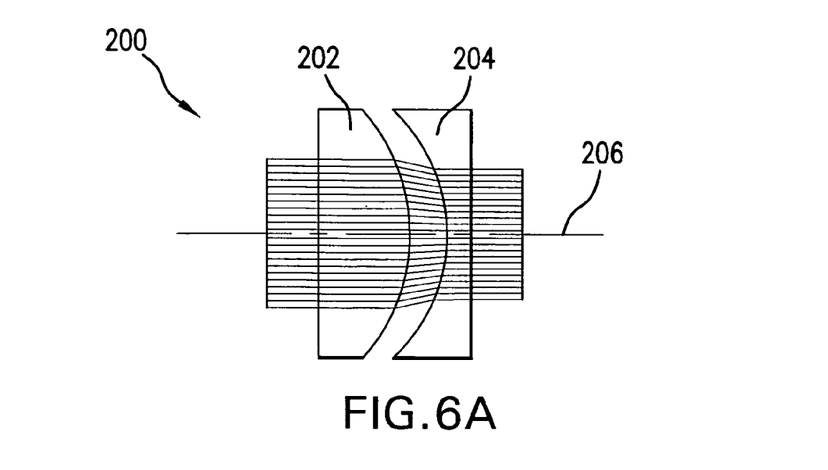
FIGS. 6A-C show an active bandwidth control system optic to selectively alter a laser beam wavefront in a laser cavity to adjust an output laser bandwidth in response to the control signal.

FIG. 6A shows another aspect of an embodiment of the present invention, in which an active bandwidth control system may include an optic 200, positioned along a laser beam path. The optic 200 may be configured to selectively alter a laser beam wavefront in the laser cavity, for example, to adjust an output laser bandwidth in response to the control signal, e.g., a control signal from the wavemeter 50 shown in FIG. 2. The optic 200 may be used in place of, or in addition to, the adjustable aperture blocking subsystem 56, 56' describe above.

Figure 6B:
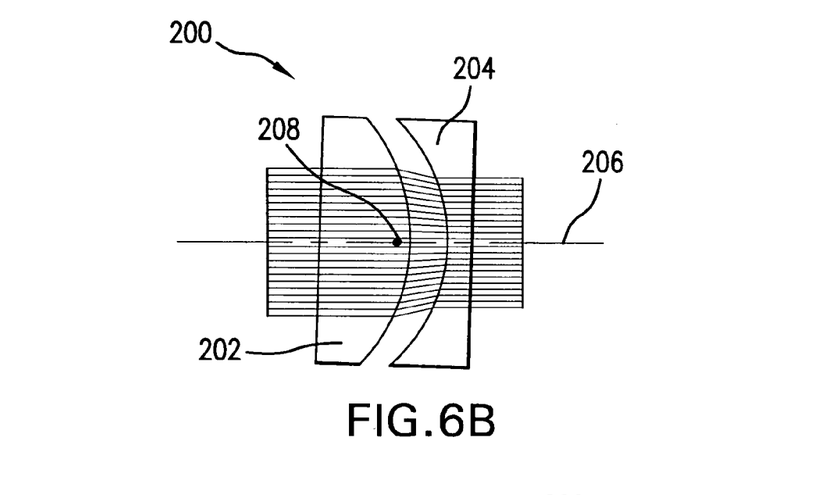

In greater structural detail, the optic 200 shown in FIG. 6A may include a positive cylindrical lens 202 and a negative cylindrical lens 204. For the optic 200, the positive cylindrical lens 202 and negative cylindrical lens 204 may constitute an afocal pair that is positioned along a beam path, and, the afocal pair may be centered on a laser axis 206 as shown in FIG. 6A to leave the wavefront of light passing through the optic 200 substantially unchanged. On the other hand, when the afocal pair is tilted, i.e., rotated about an axis 208 which is normal to the laser axis 206, as shown in FIG. 6B for a rotation of about 2 degrees, the wavefront of light passing through the optic 200 will be altered. In one implementation, the pair is tilted about an axis 208 that is parallel to the length of the fixed aperture 58 (see FIG. 4). Specifically, this wavefront deformation is illustrated by FIGS. 7A-C, with FIG. 7A corresponding to FIG. 6A (no optic 200 rotation and no wavefront deformation), FIG. 7B corresponding to FIG. 6B (2 degrees optic 200 rotation and slight coma wavefront deformation), and FIG. 7C corresponding to FIG. 6B (3.5 degrees optic 200 rotation and pronounced coma wavefront deformation).

Rotation of the optic 200 can be accomplished using a suitable optical mount and actuator (not shown) which may include, for example, a motor and/or an actuable material, e.g., piezoelectric, magnetostrictive, etc.

Figure 7A:
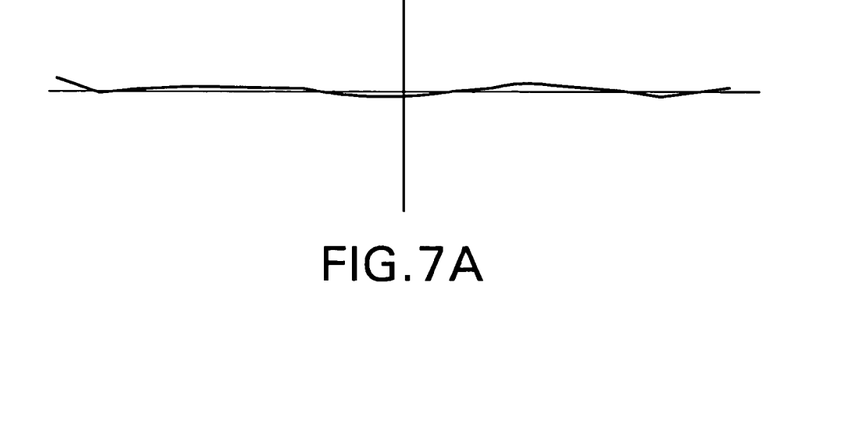
FIGS. 7A-C show wavefront v. space diagrams for an undeformed wavefront (FIG. 7A), a wavefront having slight coma (FIG. 7B) and a wavefront having substantial coma (FIG. 7C)
Figure 7B:
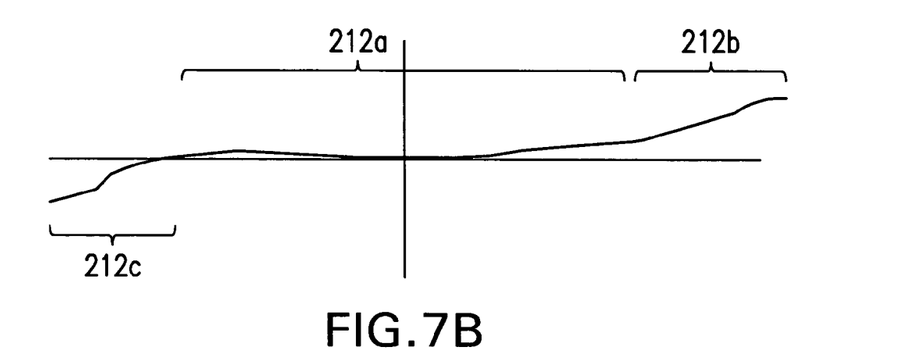
Figure 7C:
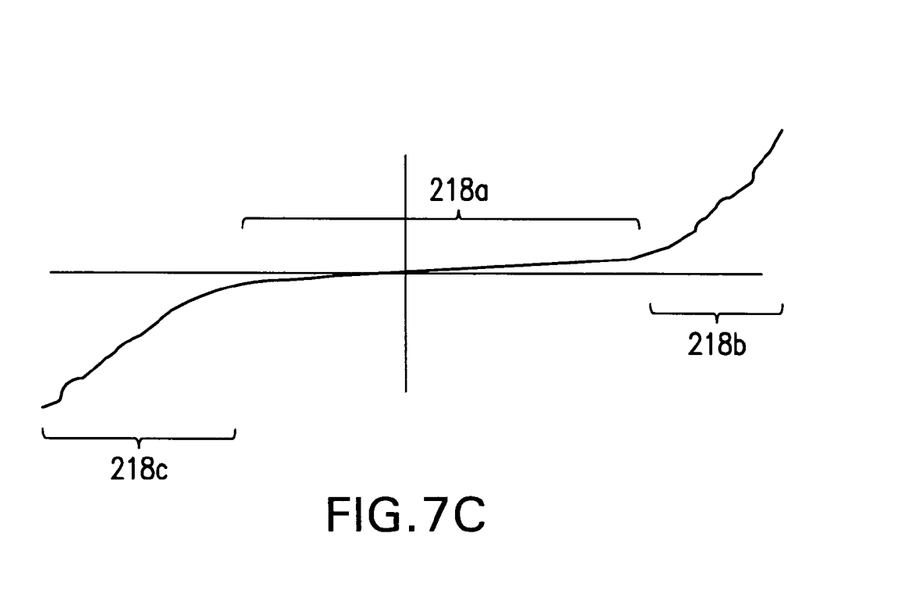
Figure 8A:
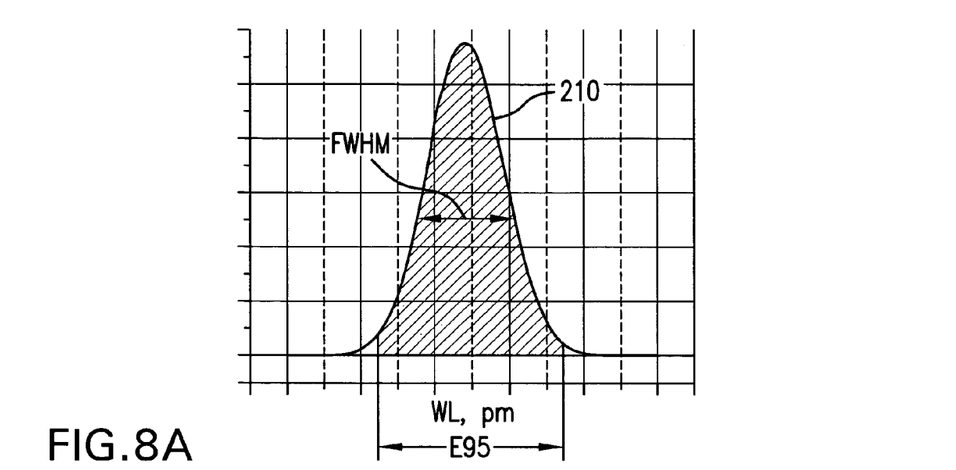
FIGS. 8A-C show wavelength v. intensity curves for an undeformed wavefront exiting a tuned laser cavity (FIG. 8A), a wavefront having slight coma exiting a tuned laser cavity (FIG. 8B) and a wavefront having substantial coma exiting a tuned laser cavity (FIG. 8C)
Figure 8B:
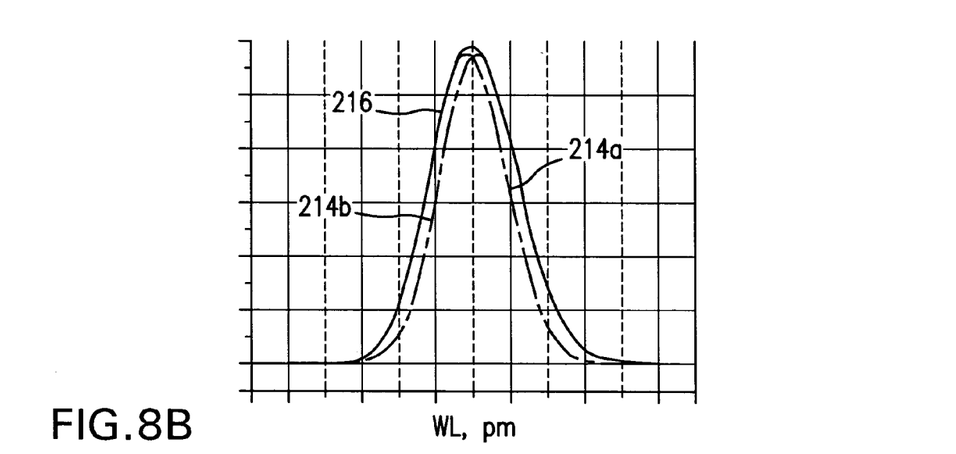
Figure 8C:
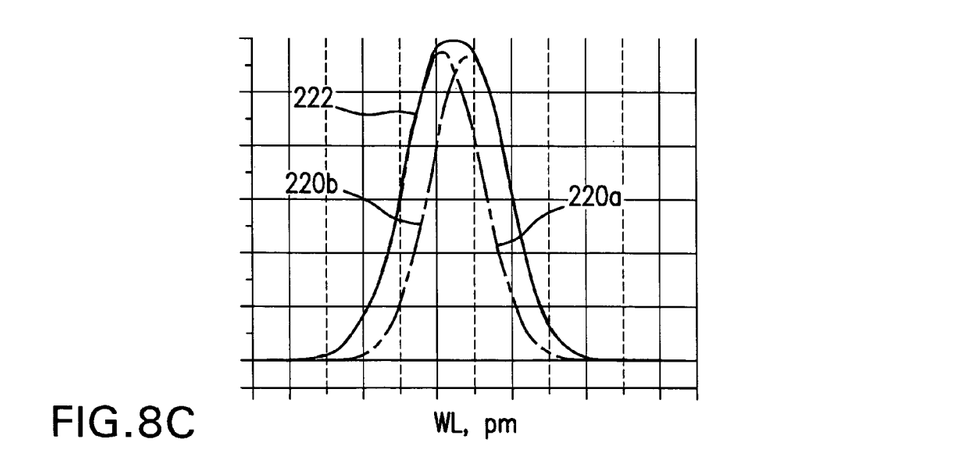

A comparison of FIGS. 7A-C with FIGS. 8A-C illustrates how rotation of the optic 200 can be used to selectively alter bandwidth within a laser cavity such as the laser cavity shown in FIG. 2. In this regard, FIGS. 6A and 7A correspond to FIG. 8A. Specifically, with no optic 200 rotation and no wavefront deformation, a laser output is produced having a bandwidth curve 210 which can be describe by a lorentzian curve having a FWHM bandwidth and E95 bandwidth as shown.

FIGS. 6B and 7B correspond to FIG. 8B. In detail, with the 2 degrees rotation of the optic 200 shown in FIG. 6B, a slight coma wavefront deformation is established in the laser beam. This deformation is shown in FIG. 7B and includes three wavefront regions: region 212a which may have little or no wavefront deformation, region 212b which may have a slightly tilted wavefront relative to undeformed region 212a, and region 212c which also may have a slightly tilted wavefront relative to undeformed region 212a. With the wavefront tilt shown in FIG. 6B, regions 212b and 212c will illuminate the grating 42 (see FIG. 2) at a slightly different angle of incidence than region 212a. It is to be appreciated that illuminating the grating at two angles of incidence will result in an output beam as shown in FIG. 8B. Specifically, curve 214a corresponds to the undeformed region 212a after reflection from the grating and curve 214b corresponds to the undeformed regions 212b, 212c after reflection from the grating. The laser output bandwidth (curve 216), which is the summation of curves 214a and 214b, is also shown.

Figure 6C:
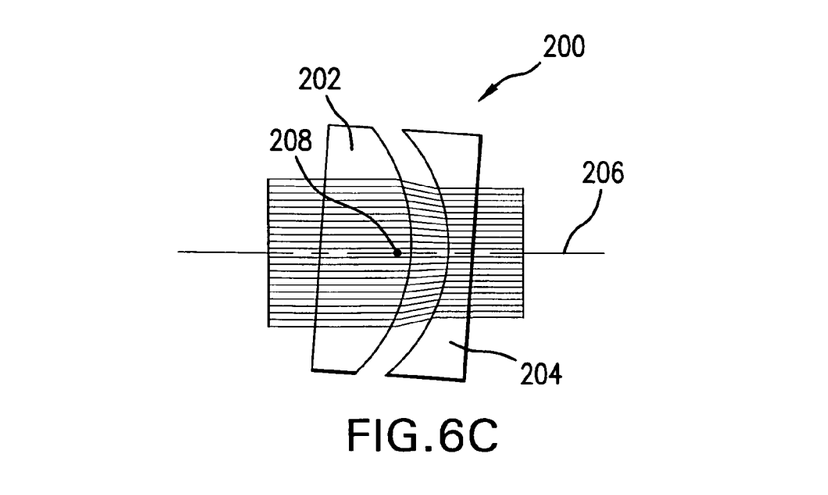

FIGS. 6C and 7C correspond to FIG. 8C. In detail, with the 3.5 degrees rotation of the optic 200 shown in FIG. 6C, a substantial coma wavefront deformation is established in the laser beam. This deformation is shown in FIG. 7C and includes three wavefront regions: region 218a which may have little or no wavefront deformation, region 218b which may have a substantially tilted wavefront relative to undeformed region 218a, and region 218c which also may have a substantially tilted wavefront relative to undeformed region 218a. With the wavefront tilt shown in FIG. 6C, regions 218b and 218c will illuminate the grating 42 (see FIG. 2) at a slightly different angle of incidence that region 218a. It is to be appreciated that illuminating the grating at two angles of incidence will result in an output beam as shown in FIG. 8C. Specifically, curve 220a corresponds to the undeformed region 218a after reflection from the grating and curve 220b corresponds to the deformed regions 218b, 218c after reflection from the grating. The laser output bandwidth (curve 222), which is the summation of curves 220a and 220b, is also shown. Comparing FIGS. 8A, 8B and 8C, it can be seen that increasing coma increases FWHM, with little or no effect on E95.

Figure 9A:
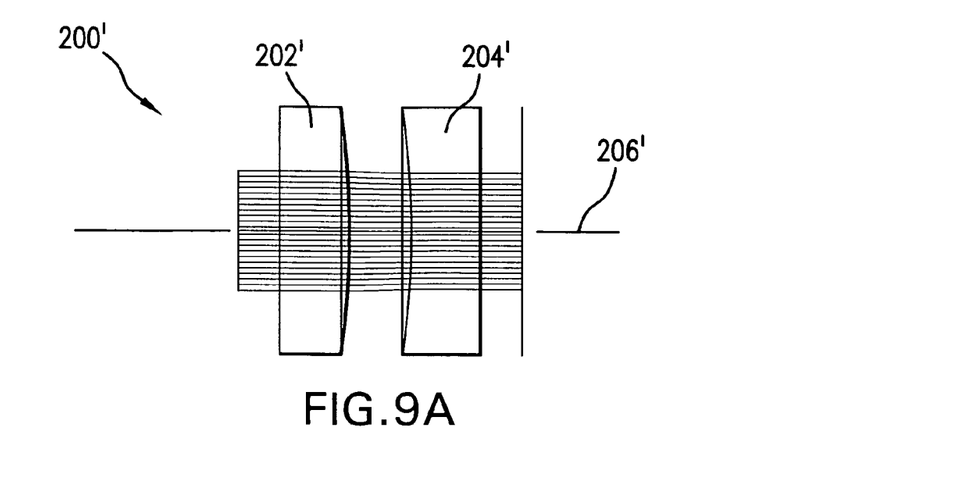
FIGS. 9A-C show another embodiment of an active bandwidth control system optic to selectively alter a laser beam wavefront in a laser cavity to adjust an output laser bandwidth in response to the control signal.
Figure 9B:
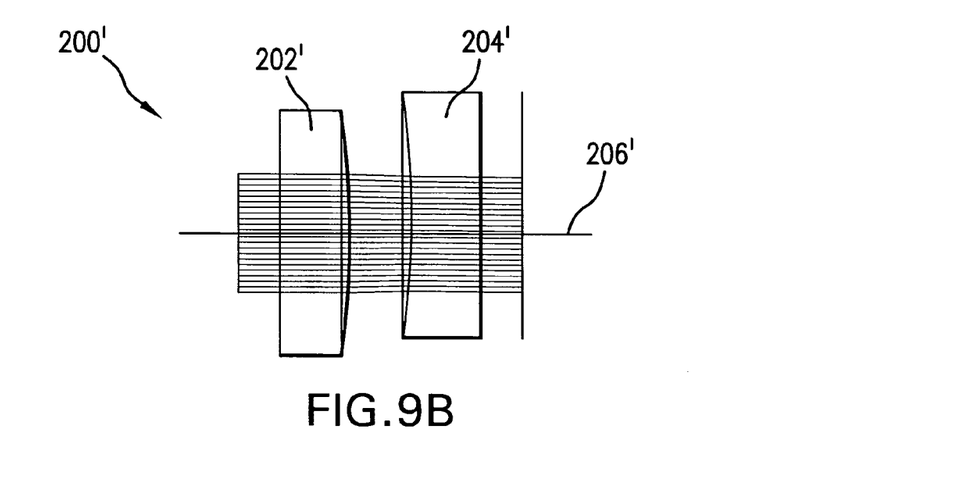
Figure 9C:
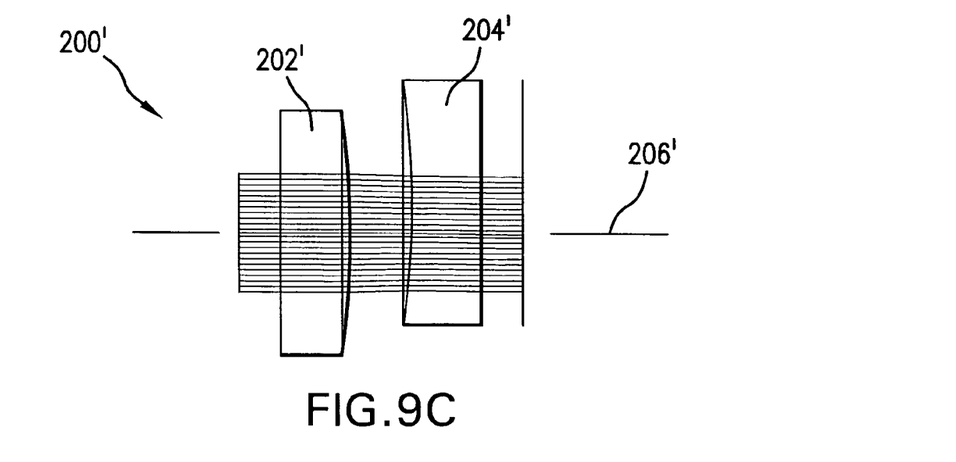

FIGS. 9A-C shows another aspect of an embodiment of the present invention, in which an active bandwidth control system may include an optic 200', positioned along a laser beam path. The optic 200' may be configured to selectively alter a laser beam wavefront in the laser cavity, for example, to adjust an output laser bandwidth in response to the control signal, e.g., a control signal from the wavemeter 50 shown in FIG. 2. The optic 200' may be used in place of the optic 200 shown in FIG. 6A to selectively produce the coma shown in FIGS. 7A-7C and the corresponding bandwidths shown in FIGS. 8A-8C.

In more detail, the optic 200' shown in FIG. 9A may include a positive cylindrical lens 202' and a negative cylindrical lens 204'. For the optic 200', the positive cylindrical lens 202' and negative cylindrical lens 204' may constitute an afocal pair that is positioned along a beam path, and, the afocal pair may be centered on a laser axis 206' as shown in FIG. 9A to leave the wavefront of light passing through the optic 200 substantially unchanged. On the other hand, when one (or both) of the lenses 202', 204' is decentered (i.e., moved in a direction normal to the laser axis 206') the wavefront of light passing through the optic 200' will be altered. For example, FIG. 9B shows a decentration of lens 202' by 2 mm which results in a slight wavelength deformation as shown in FIG. 7B resulting in a bandwidth shown in FIG. 8B. Also, FIG. 9C shows a decentration of lens 202' by 3 mm which results in a substantial wavelength deformation as shown in FIG. 7C resulting in a bandwidth shown in FIG. 8C. Movement of one or more of the lenses 202', 204' in the optic 200' can be accomplished using a suitable optical mount and actuator (not shown) which may include, for example, a motor and/or an actuable material, e.g., piezoelectric, magnetostrictive, etc. In one implementation, the decentration of lens 202' is made in a direction parallel to the width of the fixed aperture 58 (see FIG. 4).

While the particular aspects of embodiment(s) described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the present invention are merely exemplary, illustrative and representative of the subject matter which is broadly contemplated by the present invention. The scope of the presently described and claimed aspects of embodiments fully encompasses other embodiments which may now be or may become obvious to those skilled in the art based on the teachings of the Specification. The scope of the present invention is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act".

It will be understood by those skilled in the art that the aspects of embodiments of the present invention disclosed above are intended to be preferred embodiments only and not to limit the disclosure of the present invention(s) in any way and particularly not to a specific preferred embodiment alone. Many changes and modification can be made to the disclosed aspects of embodiments of the disclosed invention(s) that will be understood and appreciated by those skilled in the art. The appended claims are intended in scope and meaning to cover not only the disclosed aspects of embodiments of the present invention(s) but also such equivalents and other modifications and changes that would be apparent to those skilled in the art.

We claim:

1. A lithography apparatus for exposing a resist with a pre-selected pattern, said apparatus comprising:
   a mask designed using optical proximity correction to produce said pre-selected pattern on said resist;
   an instrument measuring laser bandwidth of at least one pulse in a burst of pulses; and
   a laser source for generating a burst of laser light pulses for transmission through said mask to expose said resist, said source comprising;
   an active bandwidth control system responsive to a bandwidth measurement control signal to cause the source to produce a pulse in the burst having a pulse bandwidth larger than a previous pulse in the burst.

2. An apparatus as recited in claim 1 wherein said laser source defines a resonant laser cavity and said active bandwidth control system comprises an optic for altering a wavefront of a laser beam in said cavity and a dispersive element to selectively adjust an output laser bandwidth.

3. An apparatus as recited in claim 2 wherein said optic alters coma.

4. An apparatus as recited in claim 3 wherein said optic comprises a positive lens and a negative lens.

5. An apparatus as recited in claim 3 wherein said optic comprises a positive cylindrical lens and a negative cylindrical lens.

6. An apparatus as recited in claim 5 wherein said positive cylindrical lens and said negative cylindrical lens comprise an afocal pair.

7. An apparatus as recited in claim 3 wherein one of said cylindrical lenses is moveable relative to the other cylindrical lens to alter coma.

8. An apparatus as recited in claim 5 wherein said laser beam defines a laser axis at said moveable cylindrical lens and said lens movement is in a direction non-parallel to said laser axis.

9. An apparatus as recited in claim 5 wherein said laser beam defines a laser axis at said cylindrical lenses and said lenses are rotated about an axis normal to said laser axis to alter coma.

10. An apparatus as recited in claim 1 wherein said instrument comprises an etalon and a photodetector array.

11. An apparatus as recited in claim 1 wherein said laser source produces a laser having a wavelength variation across an aperture and said active bandwidth control system comprises:
    an instrument measuring laser bandwidth and producing a control signal proportional thereto; and
    an aperture blocking element moveable to adjust a size of the aperture to selectively vary an output laser bandwidth in response to said control signal.

12. An apparatus as recited in claim 11 wherein said laser source comprises a gas discharge laser having two spaced apart discharge electrodes defining an arc direction and said element is moveable in a direction normal to said arc direction.

13. An apparatus as recited in claim 11 wherein said element comprises a first plate and a second plate with said second plate simultaneously moveable with said first plate to adjust said aperture size.

14. An apparatus as recited in claim 1 wherein said measured pulse and said subsequent pulse are both in a same burst of pulses.

15. An apparatus as recited in claim 1 wherein said measured pulse and said subsequent pulse are both in a same pulse window, said pulse window having between 3 and 50 pulses.

16. An apparatus as recited in claim 2 wherein said dispersive element comprises a grating.

17. An active bandwidth control system operable within a burst of pulses from a pulsed laser source, said laser source defining a resonant laser cavity, said system comprising:
    an instrument to measure laser bandwidth and produce a control signal proportional thereto; and
    an optic for altering a wavefront of a laser beam in said cavity to selectively increase an output laser pulse bandwidth relative to a previous pulse in the burst in response to said control signal.

18. A system as recited in claim 17 wherein said optic alters coma.

19. A system as recited in claim 18 wherein said optic comprises a positive cylindrical lens and a negative cylindrical lens.

20. A system as recited in claim 19 wherein said positive cylindrical lens and said negative cylindrical lens comprise an afocal pair.

21. A system as recited in claim 19 wherein one of said cylindrical lenses is moved relative to the other cylindrical lens to alter coma.

22. A system as recited in claim 21 wherein said laser beam defines a laser axis at said moveable cylindrical lens and said lens movement is in a direction non-parallel to said laser axis.

23. A system as recited in claim 19 wherein said laser beam defines a laser axis at said cylindrical lenses and said lenses are rotated about an axis normal to said laser axis to alter coma.

24. A system as recited in claim 19 wherein said instrument comprises an etalon and a photodetector array.

25. An active bandwidth control system operable within a burst of pulses from a pulsed laser source, said laser source defining a resonant laser cavity and producing a laser having a wavelength variation across an aperture, said system comprising:
    an instrument measuring laser bandwidth and producing a control signal proportional thereto; and
    an aperture blocking element in said cavity and moveable to adjust a size of the aperture to increase an output laser pulse bandwidth relative to a previous pulse in the burst in response to said control signal.

26. A system as recited in claim 25 wherein said laser source comprises a gas discharge laser having two spaced apart discharge electrodes defining an arc direction and said element is moveable in a direction normal to said arc direction.

27. A system as recited in claim 25 wherein said element comprises a first plate and a second plate with said second plate simultaneously moveable with said first plate to adjust said aperture size.

28. A system as recited in claim 25 wherein said instrument comprises an etalon and a photodetector array.

* * * * *